United States Patent [19]

Guttag et al.

[11] Patent Number: 4,469,964
[45] Date of Patent: Sep. 4, 1984

[54] SYNCHRONIZER CIRCUIT

[75] Inventors: Karl M. Guttag, Houston, Tex.; James Carey, Oakley, England

[73] Assignee: Texas Instruments Incorporated, Dallas, Tex.

[21] Appl. No.: 285,207

[22] Filed: Jul. 20, 1981

[51] Int. Cl.³ ............... H03K 17/30; H03K 19/095; H03K 3/286
[52] U.S. Cl. .................. 307/481; 307/269; 307/362; 307/582; 307/279; 328/201
[58] Field of Search ............... 307/443, 448, 453, 464, 307/475, 480, 481, 527, 528, 362, 238.6, 582, 269, 279, 247 R; 328/63, 72, 110, 139, 201; 365/233; 377/71, 78

[56] References Cited

U.S. PATENT DOCUMENTS

| | | | |
|---|---|---|---|
| 3,612,906 | 10/1971 | Kennedy | 328/72 X |
| 3,675,144 | 7/1972 | Zuk | 307/443 X |
| 3,761,739 | 9/1973 | East et al. | 307/443 X |
| 3,820,030 | 6/1974 | Williams | 328/63 |
| 3,947,697 | 3/1976 | Archer et al. | 328/63 X |
| 3,953,744 | 4/1976 | Kawagoe | 307/453 X |
| 4,035,663 | 7/1977 | Stodola | 307/480 X |
| 4,138,613 | 2/1979 | Tanaka | 307/238.6 X |
| 4,250,406 | 2/1981 | Alaspa | 307/481 X |
| 4,317,053 | 2/1982 | Shaw et al. | 328/72 X |

OTHER PUBLICATIONS

Chaney et al., "Beware the Synchronizer" Compcon-72, IEEE Computer Society Conference, San Francisco, Ca., Sep. 12–14, 1972.
Elineau et al., "A New J-K Flip-Flop for Synchronizers", IEEE Transactions on Computers, vol. C-26, No. 12, 12-1977, pp. 1277–1279.
Chaney et al., "Anomalous Behavior of Synchronizer and Arbiter Circuits," IEEE Transactions on Computers, vol. C-22, No. 4, 4-1973, pp. 421–422.
Marino, "The Effect of Asynchronous Inputs on Sequential Network Reliability," IEEE Transactions on Computers, vol. C-26, No. 11, 11-1977, pp. 1082–1090.

Primary Examiner—Larry N. Anagnos
Assistant Examiner—David R. Hudspeth
Attorney, Agent, or Firm—Mel Sharp; N. Rhys Merrett; Thomas E. Tyson

[57] ABSTRACT

A digital synchronizer includes a latch connected to a level sensitive circuit. The latch is constructed to provide a rapid transition between logic "0" and logic "1". In addition, the latch is periodically cleared. The level sensitive circuit provides a propagation barrier to any metastable state that may be present in the latch. However, the level sensitive circuit is also constructed for rapid transition from logic "0" to logic "1" when such a state occurs within the latch. An additional latch is connected in a further embodiment to provide additional reliability of the synchronizer circuit. The second latch is a two inverter latch with refresh for ¾ of a machine cycle to allow any transients conditions within the latch to dampen out.

6 Claims, 6 Drawing Figures

SYNCHRONIZER CIRCUIT

BACKGROUND

1. Field of the Invention

This invention relates to synchronizers for digital logic networks, computers and synchronous sequential networks.

2. Description of the Prior Art

Modern computers are synchronous in nature. They include synchronous sequential networks that are regulated by clock circuitry. This synchronous nature results in the ease of design and integration of smaller sequential circuits on integrated chips. However, to interface to the external world, the sequential networks must also interface with asynchronous inputs. The asynchronous is a signal that occurs at some time not subject to the regulation of the clock circuitry for the synchronous circuit. The requirement for an input to the synchronous network is that any asynchronous signal be maintained so that the synchronous circuit can detect its presence. In previous computers this has been done with a flip flop. In other words, the asynchronous signal is an input to a flip flop which is clocked by the internal clock of the synchronous system. The existence of the asynchronous input is then a level output of the flip flop. After this input is acknowledged, the flip flop is then cleared in order to receive additional asynchronous inputs. Problems with this circuit can occur when the flip flop is being clocked at the same time an asynchronous event occurs. In other words, as the circuit is being clocked, the asynchronous level is being raised. At the falling edge of the clock, the occurrence of an asynchronous signal places the flip flop in what is termed a metastable condition. This is a condition in the flip flop where the flip flop is between a logic 0 and a logic 1 which are representative of the output voltages of the flip flop. In the metastable condition the voltage maintained by the flip flop is between the regions designated for logic 0 and logic 1. The probability of this type of condition occurring is directly related to the speed of the machine since the speed of the device determines the rate that the flip flop receives the clock signal and thus determines the number of clock falling edges present per unit time. As the speeds of synchronous devices increases, the occurrence of this asynchronous interface problems becomes more prevalent.

Many articles have been written about this asynchronous interface problem. The solutions suggested include the use of synchronizers to synchronize the occurrence of the asynchronous event with the synchronous circuit clock. The purpose of a synchronizer is to receive an asynchronous event and interface this occurrence with a synchronous system. One such paper is "Beware the Synchronizer" by T. J. Chaney, F. M. Ornstein and W. M. Littlefield, COMPCON-72, IEEE Computer Society Conference, San Francisco, California, Sept. 12-14, 1972. This paper suggested the use of a flip flop with a metastable detector. In other words, a circuit that detects the existence of a metastable condition in the flip flop. Another solution suggested by G. Elineau and Warner Wiesbeck in *IEEE Transactions On Computers*, Vol. C-26, No. 12, December 1977, p 1277-1279 includes a new type of JK flip flop for synchronizers. This flip flop is specifically developed for synchronizer circuits and allows the internal clock of the synchronizer circuit to operate at a higher speed. A third solution suggested by Leonard Marino in his paper, "The Effect of Asynchronous Inputs on Sequential Network Reliability", in *IEEE Transactions On Computers*, Vol. 26, No. 11, November 1977, p. 1082-1090 is the use of delays to allow the flip flops to settle to a stable state to prevent any so called runt pulses from generating metastable conditions. However, another paper by T. J. Chaney and C. E. Molnar entitled, "Anomalous Behavior of Synchronizer and Arbiter Circuits", appearing in the *IEEE Transactions On Computers*, Vol. C-22, No. 4, April 1973, pp 421-422, states that use of delays will not completely solve the problem but only allow for some improvement. Therefore, the prior art allows certain solutions to improve the performance of synchronizers, but the goal of synchronizer reliability is still elusive. The goal for synchronous system designers is to design a synchronizer with reliability that is as great as the reliability of the component in the synchronous circuits.

SUMMARY OF THE INVENTION

In accordance with the present invention, a digital synchronizer for connection to a synchronous system is provided which includes a storage capability with a circuit connected that will only produce an output upon the reception of a predetermined input voltage. The digital synchronizer is to be connected to the synchronous system in order to prevent the propagation of a metastable condition into the synchronous system.

In one embodiment of the invention, a digital synchronizer is provided which includes storage circuitry connected to receive an asynchronous input into the synchronous system. The storage circuit's output is connected to a level sensitive circuit that is designed to produce an output only upon the reception of an input voltage level greater than the metastable voltage level of the storage circuitry.

In a further embodiment of this invention, the storage circuit is connected to the input terminal for receiving asynchronous signals and connected to a level sensitive circuit which will produce an output voltage upon receiving an input voltage of a level greater than the metastable voltage level for the storage circuitry. In addition, a latch is connected to the output of the level sensitive circuit that will store the occurrence of the output voltage from the level sensitive circuit.

DETAILED DESCRIPTION OF THE INVENTION

Figure 1:
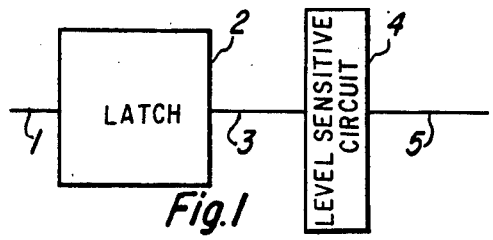
FIG. 1 is a block diagram of an embodiment of the synchronizer.

The purpose of a synchronizer is to receive an asynchronous event and interface this occurrence with a synchronous system. Referring to FIG. 1, the asynchronous input occurs on line 1. This asynchronous input occurs as a level input. A latch 2 receives this input and maintains a level on line 3 to indicate the occurrence of the asynchronous event on line 1. A level sensitive circuit 4 prevents the propagation of any metastable state that might occur in block 2 from being transmitted through to line 5. Line 5 is the output of the synchronizer and will interface to the synchronous network.

Figure 2:
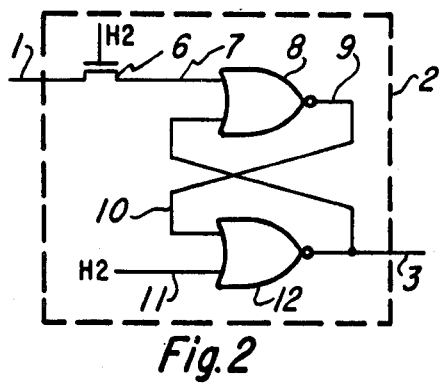
FIG. 2 is a schematic of a flip flop storage latch used in the synchronizer shown in FIG. 1.

Referring now to FIG. 2, the contents of latch 2 is a simple S-R flip flop of two NOR gates connected as illustrated. In this circuit configuration, the flip flop is cleared upon the occurrence of a clock pulse, H2. At the end of H2, any level present on line 1 will be sampled by device 6 and transmitted to the flip flop on line 7. It should be noted that device 6 is also clocked by H2; thus the sampling occurs at the end of the signal that clears the latch 2. Therefore, the occurrence of an asynchronous event on line 1 at the falling edge of H2 will be transmitted to the flip flop in block 2 via device 6 and through line 7 into the NOR gate 8. As the point line 7 transmits the asynchronous occurrence, the H2 input to NOR gate 12 is at "0", i.e., the falling edge of H2. Therefore, the input to the flip flop is a 0. The occurrence of a "1" on line 7 produces an output of a logic "0" on line 9 from NOR gate 8 which is transmitted to the input of NOR gate 12 via line 10. Since the value on line 11 is also "0", the output of NOR gate 12 on line 3 becomes a "1", signifying the occurrence of the asynchronous event on line "1".

The use of this type of flip flop with the clocked gate device 6 and clocked clearing on line 11 reduces the probability of a metastable state occurring since the beta ratios of the two NOR gates, 8 and 12, may be adjusted to decrease the time required for a transition from a logic "0" to a logic "1". The beta for a transistor is equal to the width of the channel over the channel length. The beta ratio for the NOR gate then is the ratio of the beta for the drive transistor over the beta for the load transistor. By constructing the NOR gates such that the beta for NOR gate 8 is much higher than the beta for NOR gate 12, the transition from a logic "0" to a logic "1" will occur in a minimum amount of time. By making this transition occur as quickly as possible, the probability of causing a metastable condition in other elements in the synchronous system is minimized.

Figure 3:
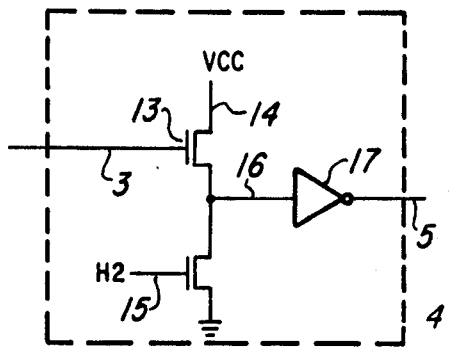
FIG. 3 is a schematic diagram of the level sensitive circuit used in the synchronizer shown in FIG. 1.

The output from the flip flop 2 is contained on line 3 and is inputted into level sensitive circuit 4. Level sensitive circuit 4 contains a level sensitive circuit which is illustrated in FIG. 3. The level sensitive circuit acts as a metastable condition resistor circuit. The output from the flip flop on line 3 is inputted into device 13. Note that H2 is also inputted into the device 15 which is connected with device 13. The source of device 13 is connected by line 14 to Vcc. The drain of device 13 is then connected to node 16 and also to the source of device 15. The drain of device 15 is connected to ground. Device 15 provides a clearing of the level sensitive circuit during H2. Note that during H2, both the flip flop and the level sensitive circuit are cleared. The output of the transistor portion of the circuit is placed on line 16 which is connected to inverter 17. The output of the level sensitive circuit is then present on line 5. The level sensitive circuit takes the input on line 3 and produces an output on line 5 in such a manner that any metastable condition that can exist on line 3 will not be transmitted to line 5. The level sensitive circuit 4 makes use of the nonlinear switching characteristics of device 13. For example, if the flip flop 2 entered a metastable state the output voltage on line 3 is typically about 0.7 volts which when inputted into device 13 causes the voltage on line 16 to be at or a little above 0 volts, thus not affecting a change of state in inverter 17 since inverter 17 requires 1 volt to change states. The voltage at node 16 is cleared or zeroed on every H2 occurrence to minimize the building up of a charge which might cause a runt signal to be transferred through inverter 17 onto the output line 5. When line 3, however, reaches a volt or more, the transistor 13 starts to switch, causing the output on node 16 to switch. The level sensitive circuit 4 is so arranged that when device 13 begins to change state, the flip flop 2 has already started the 0 to 1 transition and is well past any metastable condition. Thus the time that level sensitive circuit spends in any possible metastable condition is at a minimum. Therefore the circuit has two basic advantages. The first is that the level sensitive circuit tends to block the propagation of any metastable state from the previous latch 2 to any other synchronous devices connected to the level sensitive circuit on line 5. The second advantage is that this device produces a very quick transition when the flip flop 2 begins its transition relying on the switching characteristics of device 13. Therefore, the output on line 5 is a synchronized output and the probability on line 5 being in a metastable state is minimized.

Figure 4:
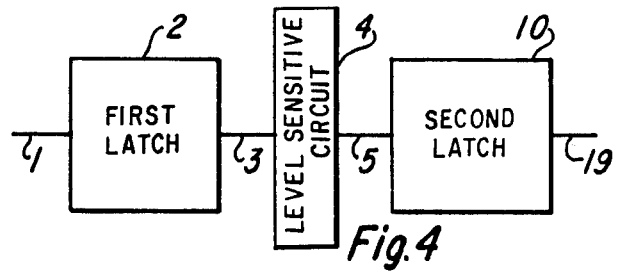
FIG. 4 is a block diagram of a second embodiment of the synchronizer.

FIG. 4 illustrates another embodiment of this invention. The asynchronous event on line 1 is inputted into a device 2, being the flip flop 2 earlier discussed. The output of the flip flop 2 is placed on line 3 which is then inputting into the level sensitive circuit 4 as previously discussed. The output of the level sensitive circuit 4 is placed on line 5 which is then placed into block 18. The output of block 18 is then placed on line 19.

Figure 5:
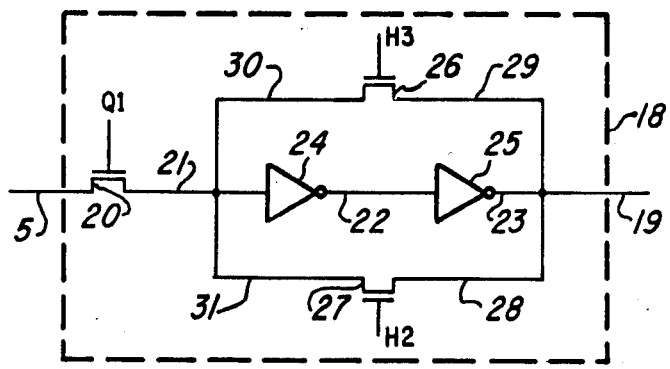
FIG. 5 is a schematic diagram of the latch used in the synchronizer shown in FIG. 4.
Figure 6:
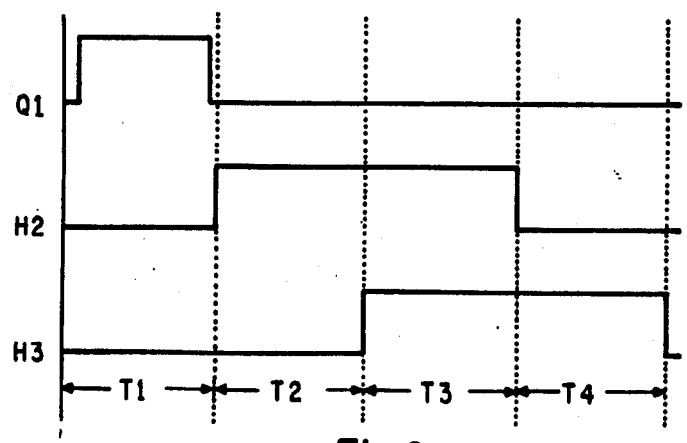
FIG. 6 is a timing diagram of the inputs to the latch circuitry in FIG. 5.

The contents of block 18 are illustrated in FIG. 5. Block 18 is a simple dual inverter latch placed in parallel with two transistor devices, 26 and 27, which are clocked by H3 and H2, respectively. The input to this inverter is clocked by a signal, $Q^1$, in device 20. Therefore, the existence of an input on line 5 will be clocked in through device 20 upon the occurrence of $Q^1$ onto line 21 where it will be stored in inverter 24, transmitted over line 22 to inverter 25 which also placed an output on line 23. The contents of these inverters are refreshed during the occurrence of H3 and H2. The timing relationships of $Q^1$, H2 and H3 are illustrated in FIG. 6. When an output is present on line 5, it is clocked through device 20 when $Q^1$ becomes high and onto line 21 where it is then placed into inverter 24, the output of inverter 24 being a "0" when a "1" is present on line 5. Line 22 is then input into inverter 25 with an output on line 23. If line 5 contains a logic "1", then the output on line 23 will be logic "1". During the occurrence of H2, the output on line 23 is then fed back to inverter 24 via line 28 through device 27, clocked by H2 onto line 31. During the occurrence of H3, the output of line 23 is also fed back to inverter 24 via line 29 through device 26 via H3 onto line 30.

Referring to FIG. 6, the occurrence of H2 and H3 overlap since the total machine cycle is made up of four minor cycles numbered in FIG. 6 as T1, T2, T3 and T4. The refresh cycle for the latch 18 is ¾ of a machine cycle. The inputs into latch 18 are only during Q1 which is less than ¼ of a machine cycle. Allowing the fedback to occur during ¾ of a machine cycle, the probability of any metastable condition existing in the latch will be minimized since any transient signals will be allowed to die out.

Referring back to FIG. 4, the digital synchronizer illustrated consists of first and second latches, 2 and 18, and a level sensitive circuit 4 connected between them.

The addition of second latch 18 provides the storage of asynchronous condition in second latch 18 for processing by the synchronous network connected via a line 19. The resulting reliability of the synchronizer has been increased since first the latch 2 has been designed using the beta ratio to maximize transition. The connection to the level sensitive circuit 4 effectively blocks any propagation that may occur in first latch 2 and further provides a quick transition on line 5 when any transition occurs at first latch 2. Also the level sensitive circuit 4 is initialized during H2. The output of the level sensitive circuit 5 is then placed into second latch 18 which minimizes the occurrence of any metastable condition by a feedback cycle of ¾ of the machine cycle as discussed.

What is claimed is:

1. A digital synchronizer for connecting to a synchronous system to prevent the propagation of a metastable condition, the synchronizer comprising:
   latch means comprising a first and second transistor logic gate connected as a S-R flip flop for storing voltage levels representative of logic states applied to the digital synchronizer, the first transistor logic gate has a beta ratio substantially higher than the beta ratio of the second transistor logic gate; and
   a level sensitive circuit means operatively connected to the latch means for producing an output upon reception of a predetermined input voltage level greater than the metastable voltage of the storage means.

2. A digital synchronizer according to claim 1, wherein said level sensitive circuit means comprises;
   an inverter, first and second field effect transistors, first field-effect transistor's source being connected to supply voltage, first field-effect transistor gate being connected to the output of the signal storage means, the first field-effect transistor drain being connected to the source of the second field-effect transistor and connected to the input of the inverter, the gate of the second field-effect transistor connected to a clearing signal, the drain of the second field-effect transistor connected to ground, and the output of the inverter being the output of the synchronizer.

3. A digital synchronizer comprising:
   signal storage means for receiving an asynchronous input, the signal means includes a clocked signal input;
   level sensitive circuit means for producing an output upon reception of a predetermined input voltage level greater than the metastable voltage of the storage means;
   the level sensitive circuit means input being connected to the signal storage means output and includes an input means for receiving a clock input for initializing the circuit means; and
   initialization means connected to the input means for initializing the contents of the signal storage means.

4. A digital synchronizer comprising:
   first signal storage means;
   circuit means for producing an output upon reception of a predetermined voltage level greater than a metastable voltage level of the storage means and whose input is connected to the signal storage means output; and
   second storage means whose input is connected to the output of the circuit means for storage of the synchronizer output.

5. A digital synchronizer according to claim 4, wherein the second storage means further comprises a switching device coupled to a latch.

6. A digital synchronizer according to claim 5, wherein said latch comprises:
   first and second inverters and first and second field effect transistor switches, the output of the first inverter being connected to the input of the second inverter, the output of the second inverter being connected to the input of both the first and second field effect transistor switches, the output of the first and second field effect transistor switches being connected to the input of the first inverter, the output of the second inverter being connected to the synchronizer output;
   first gate means connected to the first field effect transistor switch for receiving of a first clock signal to activate the first field effect transistor switch; and
   second gate means connected to the second field effect transistor switch for receiving of a second clock signal to activate the second field effect transistor switch.

* * * * *